(12) United States Patent
Toyoda et al.

(10) Patent No.: US 8,925,562 B1
(45) Date of Patent: Jan. 6, 2015

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Kazuyuki Toyoda, Toyama (JP); Tadashi Takasaki, Toyama (JP); Hiroshi Ashihara, Toyama (JP); Atsushi Sano, Toyama (JP); Naonori Akae, Toyama (JP); Hidehiro Yanai, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/229,284

(22) Filed: Mar. 28, 2014

(30) Foreign Application Priority Data

Jan. 31, 2014 (JP) ................................. 2014-016860

(51) Int. Cl.
*B08B 3/00* (2006.01)
*H01L 21/306* (2006.01)
*H01L 21/02* (2006.01)
*H01L 21/67* (2006.01)

(52) U.S. Cl.
CPC ........ *H01L 21/306* (2013.01); *H01L 21/02041* (2013.01); *H01L 21/67017* (2013.01)

USPC ....... 134/94.1; 134/95.1; 134/95.3; 134/56 R; 134/57 R; 134/182

(58) Field of Classification Search
None
See application file for complete search history.

(56) References Cited

U.S. PATENT DOCUMENTS

2012/0064733 A1* 3/2012 Sasajima et al. .............. 438/787

* cited by examiner

*Primary Examiner* — Eric Golightly
(74) *Attorney, Agent, or Firm* — Volpe and Koenig, P.C.

(57) ABSTRACT

A substrate processing apparatus includes a first gas supply system provided with a source gas supply control unit; a second gas supply system provided with a reactive gas supply control unit; a third gas supply system provided with a cleaning gas supply control unit; a shower head unit including a buffer chamber connected to the gas supply systems and a dispersion plate installed at a downstream side of the buffer chamber; a substrate support installed at a downstream side of the dispersion plate and electrically grounded; a process chamber accommodating the substrate support; a plasma generation unit including a power supply and a switch configured to switch plasma generation between the buffer chamber and the process chamber; and a control unit configured to control the source gas supply control unit, the reactive gas supply control unit and the plasma generation unit.

13 Claims, 5 Drawing Sheets

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2014-016860 filed on Jan. 31, 2014 in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

Recently, there has been a tendency to manufacture highly integrated semiconductor devices such as flash memory. Thus, pattern sizes of semiconductor devices become finer and finer. To form such a fine pattern, a predetermined treatment, such as oxidation or nitridation, may be performed on a substrate as a process included in a semiconductor device manufacturing process.

A process of forming a groove between circuits and forming a seed film, a liner film, wires, or the like in the groove is one of methods of forming the pattern. The groove is configured to have a high aspect ratio as pattern sizes become finer and finer.

To form the liner film and the like, it is required to form a high step coverage film in the groove such that the film has a uniform film thickness on an upper side surface, a middle side surface, a lower side surface, and a bottom portion of the groove. By forming the high step coverage film, a semiconductor device may have uniform characteristics between grooves, thereby suppressing a deviation in the characteristics of the semiconductor device.

There have been attempts to process a groove having a high aspect ratio by heating a gas or converting the gas into a plasma state, but a film having high step coverage is difficult to form.

To form a film having high step coverage, an alternate supply method of supplying at least two types of process gases onto a substrate among source gases and reactive gases reacting with the source gases, and reacting the supplied gases together to form a film has been introduced. In the alternate supply method, a film having a desired film thickness is formed by sequentially forming layers of the film by reacting a source gas and a reactive gas with each other on a surface of the substrate such that the formed layers are stacked together to form the film. In this method, a purge process is preferably performed between gas supply processes to remove remnant gases so that the source gas and the reactive gas may not react with each other on locations other than the surface of the substrate.

To uniformize the characteristics of a semiconductor device, a gas needs to be evenly supplied within a plane of a substrate when a thin film is formed. To this end, a single-wafer apparatus capable of evenly supplying a gas onto a surface of the substrate to be processed has been developed. In the single-wafer apparatus, for example, a shower head with a buffer space is installed on the substrate to more evenly supply a gas onto the substrate.

It has been known that in the alternate supply method described above, a remnant gas is purged with a purge gas to suppress gases from reacting with each other on locations other than a surface of a substrate while each of the gases is supplied. However, a film forming time increases when this process is included in the alternate supply method. Thus, a large amount of the purge gas is supplied to discharge the remnant gas in order to reduce a process time.

Although a path or a buffer space may be installed as an example of a shower head for each of various gases to prevent the various gases from being mixed together, the system has a complicated structure. Thus, the system is difficult to maintain and is expensive to manufacture. Accordingly, it is practical to use a shower head in which systems of supplying two types of gases and a system of supplying a purge gas are installed in one buffer space.

When the shower head including a common buffer space for two types of gases is used, it is expected that remnant gases react with each other in the shower head and a deposit is thus accumulated on inner walls of the shower head. To solve this problem, an exhaust unit configured to exhaust the space of a buffer chamber is preferably installed to efficiently remove the remnant gases from the inside of the buffer chamber. In this case, a gas guide configured, for example, to form a desired gas flow is installed in the buffer chamber to prevent two types of gases and a purge gas to be supplied into a process chamber from diffusing toward exhaust holes connected to the exhaust unit. The gas guide is preferably installed, for example, toward a diffusion plate of the shower head in a radial form and between the exhaust holes through which the buffer space is exhausted and gas supply holes through which the two types of gases and the purge gas are supplied. In order to efficiently remove a gas from an inner space of the gas guide, the space between the inside of the gas guide and the exhaust holes for exhausting the buffer space, and particularly, the space between the circumferential edge of the gas guide and the exhaust holes are communicated with one another.

SUMMARY OF THE INVENTION

Conventionally, the inventors of the present application have conducted research and found a problem of the related art. Specifically, when a process gas is supplied, the process gas diffuses toward exhaust holes from the space between the circumferential edge of a gas guide and the exhaust holes. Since the process gas diffusing to an upper portion of the gas guide from the space remains as a deposit in a gas stagnation region in the vicinity of the gas guide, a remnant gas is difficult to remove from the buffer space described above. The deposit may be particles and thus degrade the quality of a substrate or the yield.

To remove the deposit, a shower head may be removed and the deposit may be manually removed from the gas stagnation region by an operator during device maintenance. However, in this case, a downtime significantly increases, thereby lowering the working efficiency of a device.

It is an object of the present invention to provide a substrate processing apparatus and a method of manufacturing a semiconductor device which are capable of maintaining a high working efficiency of even an apparatus using a shower head.

According to one aspect of the present invention, there is provided a substrate processing apparatus including: a first gas supply system connected to a source gas source and including a first gas supply pipe provided with a source gas supply control unit; a second gas supply system connected to a reactive gas source and including a second gas supply pipe provided with a reactive gas supply control unit; a third gas supply system connected to a cleaning gas source and including a third gas supply pipe provided with a cleaning gas supply control unit; a shower head unit including a buffer chamber connected to the first gas supply system, the second gas supply system and the third gas supply system and a dispersion plate installed at a downstream side of the buffer chamber; a substrate support installed at a downstream side of the dispersion plate and electrically connected to a ground; a process chamber accommodating the substrate support; a plasma generation unit including a power supply and a switch configured to switch between a plasma generation in the buffer chamber and a plasma generation in the process chamber; and a control unit configured to control at least the source gas supply control unit, the reactive gas supply control unit and the plasma generation unit.

According to another aspect of the present invention, there is provided a method of manufacturing a semiconductor device, including: (a) loading a substrate into a process chamber; (b) processing the substrate by supplying a process gas into the process chamber via a shower head disposed above the process chamber and including a buffer chamber; (c) unloading the substrate from the process chamber; and (d) cleaning the buffer chamber and the process chamber after performing the step (c), wherein the step (d) includes: (d-1) cleaning the buffer chamber by a plasma generation from a cleaning gas in the buffer chamber by a plasma generation unit including a plasma generation region switching unit; and (d-2) cleaning the process chamber by switching the plasma generation from the cleaning gas in the buffer chamber to a plasma generation from the cleaning gas in the process chamber by the plasma generation region switching unit.

DETAILED DESCRIPTION OF THE PREFERRED EMBODIMENTS

Figure 1:
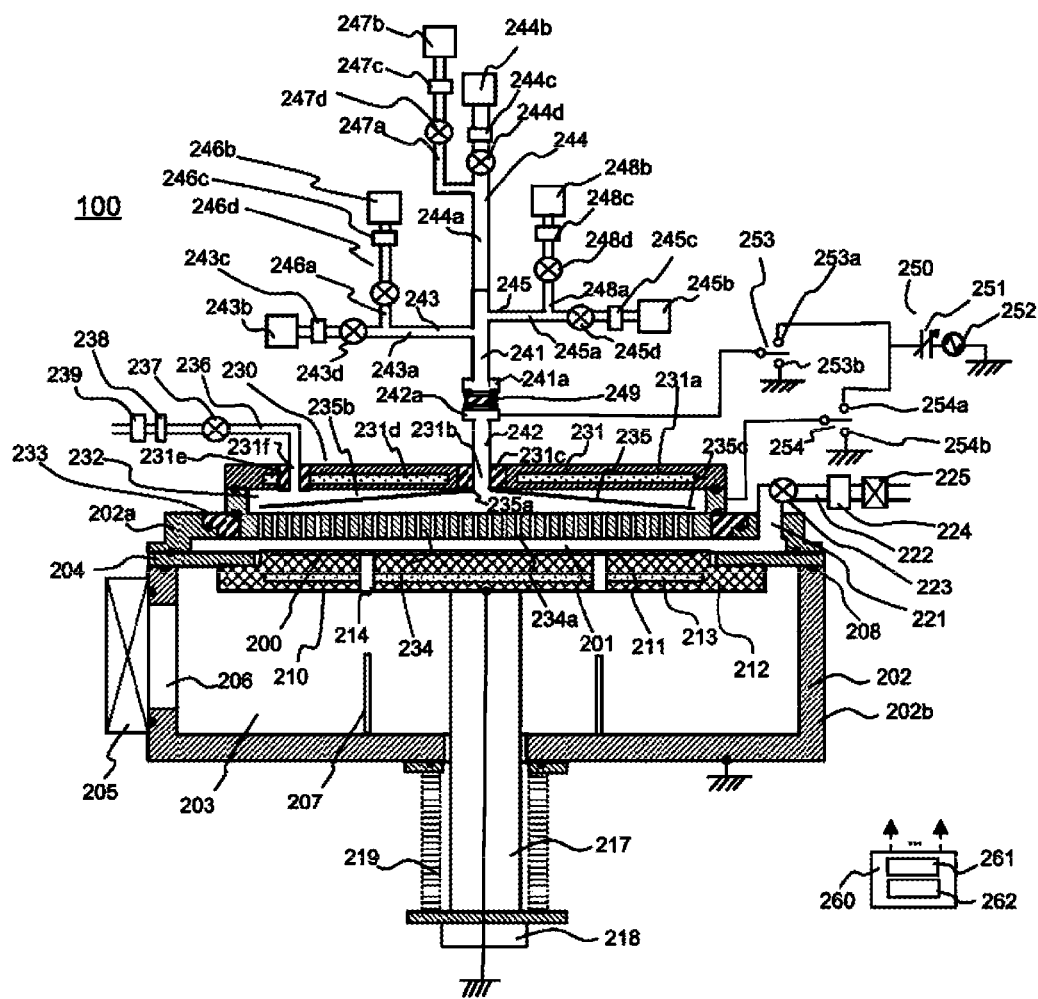
FIG. 1 is a cross-sectional view of a substrate processing apparatus according to a first embodiment of the present invention.
Figure 2:
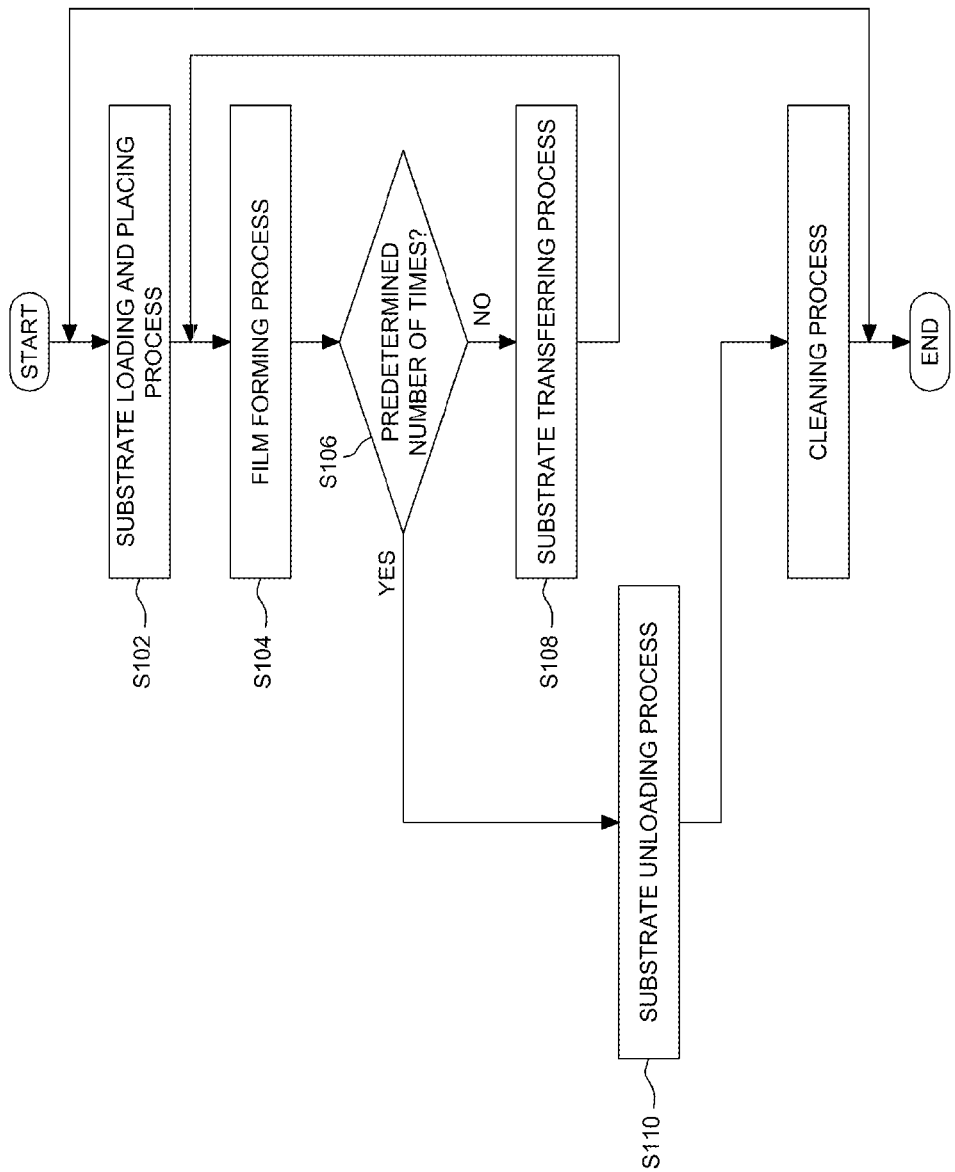
FIG. 2 is a flowchart of a substrate processing process according to the first embodiment of the present invention.

First Embodiment of the Present Invention (1) Structure of a Substrate Processing Apparatus Hereinafter, a substrate processing apparatus 100 according to a first embodiment of the present invention will be described with reference to FIG. 1. FIG. 1 is a cross-sectional view of the substrate processing apparatus 100 according to the first embodiment of the present invention.

First, the substrate processing apparatus 100 according to the first embodiment will be described below.

The substrate processing apparatus 100 according to the current embodiment will be described. The substrate processing apparatus 100 is an apparatus capable of forming a thin film and configured as a single-wafer type substrate processing apparatus as illustrated in FIG. 1.

As illustrated in FIG. 1, the substrate processing apparatus 100 includes a process container 202. The process container 202 is embodied, for example, as a flat airtight container having a circular cross-section. Also, sidewalls or a lower wall of the process container 202 is formed of a metal material, e.g., aluminum (Al) or stainless steel (steel-use-stainless: SUS)). In the process container 202, a process chamber 201 configured to process a wafer 200, e.g., a silicon wafer, as a substrate, and a transfer chamber 203 are formed. The process container 202 includes an upper container 202a, a lower container 202b, and a shower head (shower head unit) 230. The shower head 230, the upper container 202a, and the lower container 202b are sequentially installed in an upper direction.

A partition plate 204 is installed between the upper container 202a and the lower container 202b. A space surrounded by the upper container 202a and the shower head 230 and located above the partition plate 204 will be referred to as a process chamber space, and a space surrounded by the lower container 202b and located below the partition plate 204 will be referred to as a transfer space. A structure defined by the upper container 202a and a lower end of the shower head 230 and surrounding the process chamber space will be referred to as the process chamber 201. Also, a structure surrounding the transfer space will be referred to as the transfer chamber 203 included in the process chamber 201. An O-ring 208 is installed between the structures to air-tightly close the process container 202.

At a side of the lower container 202b, a substrate loading exit 206 is installed adjacent to a gate valve 205, and the wafer 200 is moved into the transfer chamber 203 via the substrate loading exit 206. A plurality of lift pins 207 are installed on a bottom portion of the lower container 202b. The lower container 202b is grounded.

In the process chamber 201, a substrate support 210 (which may be also referred to as a substrate support 210) configured to support the wafer 200 is present. The substrate support 210 mainly includes a supporting surface 211 on which the wafer 200 is placed, a substrate supporting table 212 with the supporting surface 211, and a substrate supporting table heating unit 213 (which may be also referred to as a first heating unit 213) accommodated in substrate supporting table 212 and serving as a heating source for heating the wafer 200. In the substrate supporting table 212, through-holes 214 through which the lift pins 207 pass are installed in locations corresponding to the lift pins 207. The substrate supporting table 212 is connected to the ground.

The substrate supporting table 212 is supported by a shaft 217. The shaft 217 passes through a bottom portion of the process container 202 and is connected to a lifting mechanism 218 outside the process container 202. By lifting the shaft 217 and the substrate supporting table 212 by operating the lifting mechanism 218, the wafer 200 placed on the substrate supporting surface 211 may be moved upward. Also, the circumference of a lower edge portion of the shaft 217 is covered with bellows 219, and the inside of the process container 202 is air-tightly kept.

The substrate supporting table 212 is moved downward to the substrate support 210 to move the substrate supporting surface 211 to the substrate loading exit 206 (i.e., a wafer transfer position) so as to transfer the wafer 200, and is moved upward to a process position (i.e., a wafer process position) in the process chamber 201 so as to process the wafer 200 as illustrated in FIG. 1.

In detail, when the substrate supporting table 212 is moved downward to the wafer transfer position, upper end portions of the lift pins 207 protrude from an upper surface of the substrate supporting surface 211 to support the wafer 200 with the lift pins 207 from below. When the substrate supporting table 212 is moved upward to the wafer process position, the lift pins 207 are buried into the upper surface of the substrate supporting surface 211 so that the wafer 200 may be supported by the substrate supporting surface 211 from below. Also, the lift pins 207 directly contact the wafer 200 and is thus preferably formed of, for example, a high-purity material such as quartz or alumina.

[Process Gas Introduction Hole]

In a ceiling plate 231 (which may be also referred to as the lid 231) installed on the process chamber 201, a gas introduction hole 231b is formed to supply a process gas into the process chamber 201. The structure of a process gas supply system connected to the gas introduction hole 231b will be described below. Also, the ceiling plate 231 is also used as a ceiling wall of the shower head 230 or a ceiling wall of a buffer chamber 232.

[Shower Head Unit]

The shower head (shower head unit) 230 serving as a gas dispersion mechanism mainly includes the lid (ceiling plate) 231 which is the ceiling of the shower head 230, and a gas dispersion plate (dispersion unit) 234 which is a bottom portion of the shower head 230. The lid 231 and the gas dispersion plate 234 have, for example, a plate shape, and are arranged in parallel with each other. In the shower head 230, the buffer chamber 232 is formed. The buffer chamber 232 consists of a lower edge portion of the lid 231, an upper edge portion and sidewalls of the gas dispersion plate 234. Also, the gas dispersion plate 234 may have any structure, provided that it can disperse a gas. For example, the gas dispersion plate 234 may be configured by forming holes in a sphere.

The lid 231 includes the ceiling plate 231a. On the ceiling plate 231a, the gas introduction hole 231b, an insulating member 231c, a shower head heating unit 231d (which may be also referred to as a second heating unit), an exhaust hole 231e via which an atmosphere in the buffer chamber 232 is exhausted, and an insulating member 231f are installed.

The gas introduction hole 231b is an introduction hole via which a gas is introduced into the buffer chamber 232. The insulating member 231c insulates the gas introduction hole 231b and the ceiling plate 231a from each other. The shower head heating unit 231d is buried into, for example, the ceiling plate 231a, and is formed to a plate shape to evenly heat the atmosphere in the buffer chamber 232, similar to the shape of the ceiling plate 231a. Before a gas is supplied into the process chamber 201, the gas is heated approximately to a reaction temperature in the buffer chamber 232, thereby promoting the reaction of the gas in the process chamber 201. The exhaust hole 231e is an exhaust hole via which the atmosphere in the buffer chamber 232 is exhausted. The insulating member 231f insulates the exhaust hole 231e and the ceiling plate 231a.

The gas dispersion plate 234 disperses a gas introduced from the gas introduction hole 231b, and is disposed between a space in the buffer chamber 232 and a process space in the process chamber 201. A plurality of through-holes 234a are formed in the gas dispersion plate 234. The gas dispersion plate 234 is disposed to face the substrate supporting surface 211. The gas dispersion plate 234 includes a convex part having the through-hole 234a, and a flange part installed around the convex part. The flange part is supported by an insulating block 233. As will be described below, a plasma generation unit which will be described below is electrically connected to the gas dispersion plate 234.

In the buffer chamber 232, a gas guide 235 is installed to form the flow of a supplied gas. The gas guide 235 includes a base end portion 235a, a plate portion 235b, and a front end portion 235c. The base end portion 235a is physically and electrically connected to the gas introduction hole 231b. Thus, the gas guide 235 is insulated from the ceiling plate 231a. The base end portion 235a is formed, for example, in a cylindrical shape, and is connected to the ceiling plate 231a so that the gas introduction hole 231b may be located in the inner circumference of a circle. Although the base end portion 235a has been described as having the cylindrical shape, the present invention is not limited thereto and the base end portion 235a may have a square shape.

The plate portion 235b extends from the base end portion 235a, and has a cone shape, the diameter of which becomes increased in a direction of the gas dispersion plate 234 (a direction of the process chamber 201). In other words, the plate portion 235b has a shape that is gradually separated from the ceiling plate 231a as the plate portion 235b becomes close to the gas dispersion plate 234.

The front end portion 235c is an edge portion of the plate portion 235b opposite to the base end portion 235a. That is, the front end portion 235c is an edge portion of the plate portion 235b facing the process chamber 201. The front end portion 235c is configured to have a circumferential structure similar to the base end portion 235a. The diameter of the front end portion 235c is formed to be beyond an outermost circumference of the through-holes 234a.

In the present embodiment, an internal region of the plate portion 235b (facing the gas dispersion plate 234) is referred to as an internal region 232a of the buffer chamber 232, and an external region of the plate portion 235b (facing the ceiling plate 231) is referred to as an external region 232b of the buffer chamber 232.

An exhaust pipe 236 is connected to an upper portion of the buffer chamber 232 via the exhaust hole 231e for the shower head 230. A valve 237 configured to switch gas exhausting; a pressure adjustor 238, such as an auto pressure controller (APC), configured to control the inside of the buffer chamber 232 to have a predetermined pressure; and a vacuum pump 239 are sequentially connected in series to the exhaust pipe 236. Also, the exhaust pipe 236, the valve 237, and the pressure adjustor 238 will be referred to together as a first exhaust system.

[Process Gas Supply System]

A first element containing gas is mainly supplied from a first gas supply system 243 including a first gas supply pipe 243a. A second-element-containing gas is mainly supplied from a second gas supply system 244 including a second gas supply pipe 244a. An inert gas or a cleaning gas is supplied from a third gas supply system 245 including a third gas supply pipe 245a. The first gas supply pipe 243a, the second gas supply pipe 244a, and the third gas supply pipe 245a are connected to a first common gas supply pipe 241. A second common gas supply pipe 242 is installed at a downstream side of the first common gas supply pipe 241. A gas supplied via each of these gas supply pipes is supplied into the shower head 230 via the first common gas supply pipe 241 and the second common gas supply pipe 242. The process gas supply system is also referred to as a process gas supply unit.

[Common Gas Supply Pipe]

The first gas supply pipe 243a, the second gas supply pipe 244a, and the third gas supply pipe 245a are connected to an upstream side of the first common gas supply pipe 241. A flange 241a is installed at a downstream end (a downstream side) of the first common gas supply pipe 241.

A flange 242a is installed at an upstream end of the second common gas supply pipe 242. The second common gas supply pipe 242 is formed of a conductive material, and the flange 242a is connected to a plasma generation unit 250 which will be described below. A portion of the second common gas supply pipe 242 at a downstream side of the flange 242a passes through the gas introduction hole 231b of the lid 231, and a downstream end of the second common gas supply pipe 242 is connected to the base end portion 235a of the gas guide 235. Power supplied from the plasma generation unit 250 is supplied to the gas guide 235 via the second common gas supply pipe 242.

A insulating material 249 is present between the flange 241a and the flange 242a to electrically insulate the flange 241a and the flange 242a from each other.

[First Gas Supply System]

At the first gas supply pipe 243a, a first gas source 243b, a mass flow controller (MFC) 243c which is a flow rate controller (flow rate control unit), and a valve 243d which is an opening/closing valve are sequentially installed in an upstream direction.

A gas containing a first element (hereinafter referred to the 'first-element-containing gas') is supplied into the shower head 230 from the first gas supply pipe 243a via the MFC 243c, the valve 243d, and the common gas supply pipes 241 and 242.

The first-element-containing gas is a source gas, i.e., one of process gases. Here, the first element is, for example, titanium (Ti). That is, the first-element-containing gas is, for example, a titanium-containing gas. For example, $TiCl_4$ gas may be used as the titanium-containing gas. Also, the first-element-containing gas may have a solid, liquid, or gaseous state at normal temperature and pressure. When the first-element-containing gas has a liquid state at normal temperature and pressure, a vaporizer (not shown) may be installed between the first gas source 243b and the MFC 243c. In the present embodiment, it is assumed that the first-element-containing gas has a gaseous state.

Also, a silicon containing gas may be used. For example, as the silicon containing gas, hexamethyldisilazane ($C_6H_{19}NSi_2$, abbreviated as 'HMDS'), trisilylamine [$(SiH_3)_3N$, abbreviated as 'TSA'], bis-tertiary butyl aminosilane ($SiH_2[NH(C_4H_9)]_2$, abbreviated as 'BTBAS') gas, or the like that is formed of an organic silicon material may be used. These gases act as precursors.

A downstream end of a first inert gas supply pipe 246a is connected to the first gas supply pipe 243a at a downstream side of the valve 243d. An inert gas source 246b, an MFC 246c which is a flow rate controller (flow rate control unit), and a valve 246d which is an opening/closing valve are sequentially installed to the first inert gas supply pipe 246a in the upstream direction.

Here, an inert gas is, for example, nitrogen ($N_2$) gas. In addition to the $N_2$ gas, for example, a rare gas such as helium (He) gas, neon (Ne) gas, or argon (Ar) gas may be used as the inert gas.

The inert gas is supplied into the shower head 230 from the first inert gas supply pipe 246a via the MFC 246c, the valve 246d, and the first gas supply pipe 243a. The inert gas acts as a carrier gas or a dilution gas in a thin film forming process (operation S104) which will be described below.

The first-element-containing gas supply system 243 (which may be also referred to as a titanium containing gas supply system) mainly includes the first gas supply pipe 243a, the MFC 243c, and the valve 243d.

A first inert gas supply system mainly includes the first inert gas supply pipe 246a, the MFC 246c, and the valve 246d. The first inert gas supply system may further include the inert gas source 246b, and the first gas supply pipe 243a.

The first-element-containing gas supply system 243 may further include the first gas source 243b and the first inert gas supply system.

The first gas supply system 243 is also referred to as the 'first gas supply unit'.

[Second Gas Supply System]

A second gas source 244b, an MFC 244c which is a flow rate controller (flow rate control unit), and a valve 244d which is an opening/closing valve are sequentially installed at the second gas supply pipe 244a in the upstream direction.

A gas containing a second element (hereinafter referred to as 'second-element-containing gas') is supplied into the shower head 230 from the second gas supply pipe 244a via the MFC 244c, the valve 244d, and the common gas supply pipes 241 and 242.

The second-element-containing gas is one of the process gases. Also, the second-element-containing gas may be considered as a reactive gas or a modifying gas.

Here, the second-element-containing gas contains the second element that is different from the first element. The second element is, for example, oxygen (O), nitrogen (N), or carbon (C). In the present embodiment, it is assumed that the second-element-containing gas is, for example, a nitrogen containing gas. In detail, ammonia ($NH_3$) gas is used as the nitrogen containing gas.

The second-element-containing gas supply system 244 (which may be also referred to a nitrogen containing gas supply system) mainly includes the second gas supply pipe 244a, the MFC 244c, and the valve 244d.

A downstream end of a second inert gas supply pipe 247a is connected to the second gas supply pipe 244a at a downstream side of the valve 244d. An inert gas source 247b, an MFC 247c which is a flow rate controller (flow rate control unit), and a valve 247d which is an opening/closing valve are sequentially installed at the second inert gas supply pipe 247a in the upstream direction.

An inert gas is supplied into the shower head 230 from the second inert gas supply pipe 247a via the MFC 247c, the valve 247d, and the second gas supply pipe 244a. The inert gas acts as a carrier gas or a dilution gas in the thin film forming process (operation S104) which will be described below.

A second inert gas supply system mainly includes the second inert gas supply pipe 247a, the MFC 247c, and the valve 247d. The second inert gas supply system may further include the inert gas source 247b and the second gas supply pipe 244a.

The second gas supply system 244 may further include the second gas source 244b and the second inert gas supply system.

The second gas supply system is also referred to as a second gas supply unit.

[Third Gas Supply System]

An inert gas is mainly supplied from the third gas supply system 245 including the third gas supply pipe 245a when the wafer 200 is processed.

A third gas source 245b, an MFC 245c which is a flow rate controller (flow rate control unit), and a valve 245d which is an opening/closing valve are sequentially installed at the third gas supply pipe 245a in the upstream direction.

An inert gas is supplied as a purge gas to the shower head 230 from the third gas supply pipe 245a via the MFC 245c, the valve 245d, and the common gas supply pipes 241 and 242.

Here, an inert gas is, for example, nitrogen ($N_2$) gas. In addition to the $N_2$ gas, for example, a rare gas such as helium (He) gas, neon (Ne) gas, or argon (Ar) gas may be used as the inert gas.

An inert gas source 245b, an MFC 245c which is a flow rate controller (flow rate control unit, and a valve 245d which is an opening/closing valve are sequentially installed at the third gas supply pipe 245a in the upstream direction.

The third gas supply system 245 mainly includes the third gas supply pipe 245a, the MFC 245c, and the valve 245d.

The third gas supply system 245 may further include the third gas source 245b and the cleaning gas supply system.

An inert gas is supplied into the shower head 230 from the third gas supply pipe 245a via the MFC 245c, the valve 245d, and the common gas supply pipes 241 and 242 in a substrate processing process.

An inert gas supplied from the inert gas source 245b acts as a purge gas for purging a gas remaining in the process chamber 201 or the shower head 230 in the thin film forming process (operation S104) which will be described below. In the present disclosure, the third gas supply system 245 is also referred to as a third gas supply unit.

[Second Exhaust System]

An exhaust port 221 is installed on an inner wall of the process chamber 201 (particularly, the upper container 202a) to exhaust an atmosphere in the process chamber 201. An exhaust pipe 222 is connected to the exhaust port 221. A valve 223 configured to switch gas exhausting, a pressure adjustor 224, such as an APC, configured to control the inside of the process chamber 201 to have a predetermined pressure; and a vacuum pump 225 are sequentially connected in series to the exhaust pipe 222. A second exhaust system (exhaust line) 220 mainly includes the exhaust port 221, the exhaust pipe 222, the valve 223, the pressure adjustor 224, and the vacuum pump 225.

[Plasma Generation Unit]

The plasma generation unit 250 includes a high-frequency power supply 252, a matching unit 251, a first switch 253, and a second switch 254.

A first terminal of the first switch 253 is connected to the flange 242a. A second terminal of the first switch 253 is connected to the matching unit 251 or the ground. The matching unit 251 is connected to a terminal 253a of the first switch 253, and the ground is connected to a terminal 253b of the first switch 253. Switching of the connection of the first switch 253 between the matching unit 251 and the ground is performed by a controller 260 which will be described below.

A first terminal of the second switch 254 is connected to a flange unit of the gas dispersion plate 234. A second terminal of the second switch 254 is connected to the matching unit 251 or the ground. The matching unit 251 is connected to a terminal 254a of the second switch 254, and the ground is connected to a terminal 254b of the second switch 254. Switching of the connection of the second switch 254 between the matching unit 251 and the ground is performed by the controller 260 which will be described below.

Plasma of a gas to be supplied into the buffer chamber 232 or the process chamber 201 is generated from high-frequency power output from the high-frequency power supply 252 by switching on/off the first switch 253 and the second switch 254, but the impedance of the plasma is adjusted using the matching unit 251 according to the type of each system.

The first switch 253 and the second switch 254 may be also referred to together as a plasma generation region switching unit.

[Controller]

The substrate processing apparatus 100 includes the controller 260 configured to control operations of various elements of the substrate processing apparatus 100. The controller 260 includes at least an operation unit 261 and a memory unit 262. The controller 260 calls a substrate processing apparatus program or a control recipe from the memory unit 262 according to a command received therefrom or a user, and controls various elements thereof according to the program or the control recipe (2) Substrate Processing Process A process of forming a thin film on the wafer 200 using the substrate processing apparatus 100 will now be described with reference to FIGS. 2 to 5. In the following description, the operations of various elements of the substrate processing apparatus 100 are controlled by the controller 260.

Here, a case in which a titanium nitride film is formed as a thin film on the wafer 200 using $TiCl_4$ gas as a first-element-containing gas and ammonia ($NH_3$) gas as a second-element-containing gas will be described. Also, for example, a predetermined film may be formed on the wafer 200 beforehand. Also, a predetermined pattern may be formed on the wafer 200 or the predetermined film.

[Substrate Loading and Placing Process (Operation S102)]

The substrate processing apparatus 100 causes the lift pins 207 to pass through the through-holes 214 of the substrate supporting table 212 by moving the substrate supporting table 212 downward to a position to which the wafer 200 is to be transferred. As a result, the lift pins 207 protrude by a predetermined height from the upper surface of the substrate supporting table 212. Then, the gate valve 205 is opened, and the wafer 200 (a substrate to be processed) is loaded into the process chamber 201 using a wafer transfer machine (not shown) and transferred on the lift pins 207. Thus, the wafer 200 is supported in a horizontal posture on the lift pins 207 protruding from the upper surface of the substrate supporting table 212.

When the wafer 200 is loaded into the process container 202, the wafer transfer machine is retreated to the outside of the process container 202, the gate valve 205 is closed, and the inside of the process container 202 is air-tightly closed. Then, the wafer 200 is placed on substrate supporting surface 211 of the substrate supporting table 212 by moving the substrate supporting table 212 upward.

When the wafer 200 is loaded into the process container 202, $N_2$ gas is preferably supplied as an inert gas from the inert gas supply system into the process container 202 while the inside of the process container 202 is exhausted using the exhaust system. That is, the $N_2$ gas is preferably supplied into the process container 202 by opening at least the valve 245d of the third gas supply system and the APC valve 223 while the inside of the process container 202 is exhausted by operating the vacuum pump 225. Thus, particles may be suppressed from penetrating into the process container 202 or from being attached onto the wafer 200. The vacuum pump 225 is always kept operated at least until the substrate loading and placing process (operation S102) to a substrate unloading process (operation S106) which will be described below end.

When the wafer 200 is placed on the substrate supporting table 212, power is supplied to the first heating unit 213 embedded in the substrate supporting table 212 and/or the shower head heating unit 231d so as to control a surface of the wafer 200 to have a predetermined temperature. The temperature of the wafer 200 is, for example, in a range of room temperature to 500° C. or less, and preferably, a range of room temperature to 400° C. or less. In this case, the temperature of the first heating unit 213 is adjusted by controlling the amount of electric power to the first heating unit 213 based on temperature information detected by a temperature sensor (not shown).

[Film Forming Process (Operation S104)]

Next, the thin film forming process (operation S104) is performed. A basic flow of the thin film forming process (operation S104) and the details of the present embodiment will be described below.

In the thin film forming process (operation S104), $TiCl_4$ gas is supplied into the process chamber 201 via the buffer chamber 232 of the shower head 230. The supply of the $TiCl_4$ gas is suspended a predetermined time after the $TiCl_4$ gas is supplied, and the $TiCl_4$ gas is discharged from the buffer chamber 232 and the process chamber 201 using a purge gas.

After the $TiCl_4$ gas is discharged, ammonia gas is supplied into the process chamber 201 via the buffer chamber 232 and high-frequency power is supplied to generate ammonia plasma. The ammonia gas reacts with a titanium containing film formed on the wafer 200 to form a titanium nitride film. After a predetermined time passes, the supply of the ammonia gas and the generation of the plasma are stopped, the ammonia gas is discharged from the shower head 230 and the process chamber 201 using a purge gas.

In the thin film forming process (operation S104), a titanium nitride film is formed to a desired thickness by repeatedly performing the flow of this process described above.

[Process of Determining a Number of Times of Performing the Thin Film Forming Process (Operation S106)]

After the wafer 200 is unloaded, it is determined whether the number of times of performing the thin film forming process (operation S106) reaches a predetermined number of times. When it is determined that the number of times of performing the thin film forming process (operation S106) reaches the predetermined number of times, a substrate unloading process (operation S110) which will be described below is performed. When it is determined that the number of times of performing the thin film forming process does not reach the predetermined number of times, the thin film forming process (operation S104) is performed.

[Substrate Transferring Process (Operation S108)]

Next, the substrate supporting table 212 is moved downward to support the wafer 200 on the lift pins 207 protruding from the upper surface of the substrate supporting table 212. Then, the gate valve 205 is opened, the processed wafer 200 is exchanged with another wafer 200 (not processed) using the wafer transfer machine, and the processed wafer 200 is unloaded to the outside of the process container 202. When the substrate processing process is completed by processing a predetermined number of wafers 200, supply of an inert gas into the process container 202 from the third gas supply system is stopped.

[Substrate Unloading Process (Operation S110)]

In the process of determining the number of times of performing the thin film forming process (operation S104), when it is determined that the number of times of performing the thin film forming process reaches the predetermined number of times, the substrate supporting table 212 is moved downward to support the wafer 200 on the lift pins 207 protruding from the upper surface of the substrate supporting table 212. Then, the gate valve 205 is opened, and the processed wafer 200 is discharged to the outside of the process container 202 using the wafer transfer machine.

[Cleaning Process (Operation S112)]

In the process of determining the number of times of performing the thin film forming process (operation S108), when it is determined that the number of times of performing the thin film forming process reaches the predetermined number of times, a cleaning process is performed. Here, the valve 248d of the cleaning gas supply system is opened, and a cleaning gas is supplied into the process chamber 201 via the shower head 230.

When a sufficient amount of the cleaning gas is supplied into the shower head 230 and the process chamber 201, plasma of the cleaning gas is generated in the shower head 230 and the process chamber 201 while adjusting the impedance of the plasma using the matching unit 251 together with supplying power to the high-frequency power supply 252. The generated plasma of the cleaning gas removes by-products and the like attached to the inner walls of the shower head 230 and the process chamber 201. The cleaning process (operation S112) will be described in detail below.

Figure 3:
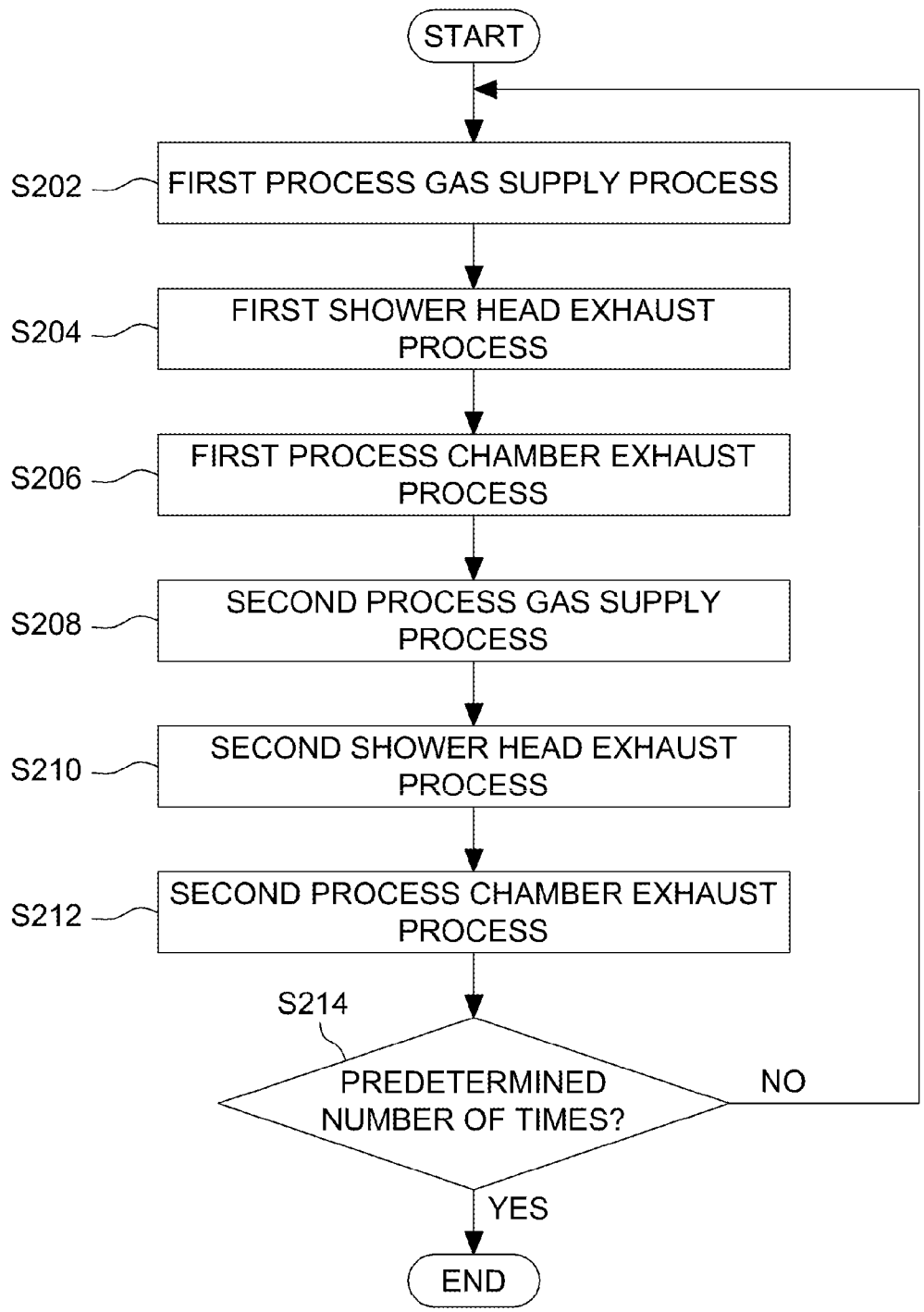
FIG. 3 is a flowchart of a film forming process according to the first embodiment of the present invention.

Then, the thin film forming process (operation S104) will be described in detail with reference to FIG. 3 below.

[First Process Gas Supply Process (Operation S202)]

When each of the wafer 200 and the first heating unit 213 reaches the desired temperature, the valve 243d is opened, and $TiCl_4$ gas is started to be supplied as the first process gas into the process chamber 201 via the gas introduction hole 231b, the buffer chamber 232, and the through-holes 234a of the gas dispersion plate 234. In this case, the valve 246d is opened, and an inert gas is also started to be supplied as a carrier gas.

In the second gas supply system, the valve 244d is 'off' and the valve 247d is 'on' to supply the inert gas, thereby preventing the first process gas from being supplied into the second gas supply pipe 244a. Accordingly, a gas may be prevented from being attached to the inside of the second gas supply pipe 244a.

In the third gas supply system, the valve 245d is opened and an inert gas is supplied into the buffer chamber 232 via the gas introduction hole 231b.

In the buffer chamber 232, a gas including the $TiCl_4$ gas is evenly dispersed through the gas guide 235. The evenly dispersed gas is evenly supplied onto the wafer 200 in the process chamber 201 via the through-holes 234a of the gas dispersion plate 234.

In this case, the flow rate of the $TiCl_4$ gas serving as the first process gas is adjusted to be equal to a predetermined flow rate through the MFC 243c. Also, the flow rate of the inert gas serving as a third process gas is adjusted to be a predetermined flow rate through the MFC 245c. For example, the supply flow rate of the $TiCl_4$ gas is in the range of 100 sccm to 5,000 sccm. Also, the vacuum pump 225 is operated to appropriately adjust the degree of openness of the APC valve 223, thereby controlling pressure in the process container 202 to be equal to a predetermined pressure.

The supplied $TiCl_4$ gas is supplied onto the wafer 200. A titanium containing layer is formed on a surface of the wafer 200 as a first-element-containing layer when the $TiCl_4$ gas comes in contact with the surface of the wafer 200.

The titanium containing layer is formed to a predetermined thickness and in a predetermined distribution, based on, for example, the pressure in the process container 202, the flow rate of the $TiCl_4$ gas, the temperature of the susceptor 210, the duration of a treatment performed in the process chamber 201, etc.

After a predetermined time passes, the valve 243d is closed and the supply of the $TiCl_4$ gas is stopped. The valve 245d is kept 'on' and the supply of the inert gas is continuously supplied.

[First Shower Head Exhaust Process (Operation S204)]

After the supply of the $TiCl_4$ gas is stopped, the valve 237 is 'on' and an atmosphere in the shower head 230 is exhausted. Specifically, an atmosphere in the buffer chamber 232 is exhausted. In this case, the vacuum pump 239 is operated beforehand. The first shower head exhaust process (operation S204) will be described in detail below.

In this case, the degree of openness of the valve 237 is adjusted such that an exhaust conductance in the buffer chamber 232 using the first exhaust system is higher than the conductance of the exhaust system of the vacuum pump 225 via the process chamber 201. Through the adjustment, a gas flow is formed from the center of the buffer chamber 232 toward the shower head exhaust hole 231e. Thus, a gas attached to an inner wall of the buffer chamber 232 or a gas floating in the buffer space may be prevented from flowing into the process chamber 201 and be exhausted from the first exhaust system.

Also, an inert gas is supplied into the buffer chamber 232 from the third gas supply system to early exhaust an atmosphere in the buffer chamber 232. In this case, the supply amount of the inert gas is preferably increased to be more than in the first process gas supply process.

[First Process Chamber Exhaust Process (Operation S206)]

After a predetermined time passes, while the vacuum pump 225 of the second exhaust system is operated, the degree of openness of the APC valve 223 and the degree of openness of the valve 237 are adjusted such that an exhaust conductance in the process space using the second exhaust system is higher than an exhaust conductance using the first exhaust system via the shower head 230. Through the adjustment, a gas flow is formed toward the second exhaust system via the process chamber 201. Thus, the inert gas supplied into the buffer chamber 232 may be supplied onto the wafer 200 without fail, thereby increasing the efficiency of removing remnant gases formed on the wafer 200.

An inert gas supplied in a process chamber exhaust process causes a titanium component that is not combined with the wafer 200 in the first process gas supply process (operation S202) to be removed from the wafer 200. Also, the valve 237 is opened, and the pressure adjustor 238 and the vacuum pump 239 are controlled to remove TiCl$_4$ gas remaining in the shower head 230. After a predetermined time passes, the valve 245d is tightened up to reduce the supply rate of the inert gas and the valve 237 is closed to disconnect the shower head 230 and the vacuum pump 239 from each other.

It is more preferable that the valve 237 be closed while the vacuum pump 225 of the second exhaust system is operated after the predetermined time passes. In this case, the flow of a gas passing through the process chamber 201 and supplied toward the second exhaust system is not influenced by the first exhaust system and the inert gas may be more surely supplied onto the wafer 200, thereby greatly increasing the efficiency of removing remnant gases from the wafer 200.

Also, when the first process chamber exhaust process (operation S206) is performed after the first shower head exhaust process (operation S204), the following effects may be obtained. That is, since a remnant gas is removed from the inside of the buffer chamber 232 in the first shower head exhaust process (operation S204), the remnant gas may be prevented from being attached onto the wafer 200 even a gas passes through the wafer 200 when the first process chamber exhaust process (operation S206).

[Second Process Gas Supply Process (Operation S208)]

In the first gas supply system, the valve 247d is kept 'on' to supply an inert gas in a state in which the valve 243d is 'off'.

In the second gas supply system, the valve 244d is 'on' to begin supply of ammonia gas.

In this case, the MFC 244c is controlled to adjust the flow rate of the ammonia gas to be equal to a predetermined flow rate. The supply flow rate of the ammonia gas is, for example, in the range of 100 sccm to 5,000 sccm. Also, N$_2$ gas may be supplied as a carrier gas from the second inert gas supply system, together with the ammonia gas. Also, the degree of openness of the APC valve 223 is appropriately controlled to adjust the pressure in the process container 202 to be equal to a predetermined pressure at which a second gas is easily excited.

An operation of the plasma generation unit 250 will be described below. In the first switch 253, the terminal 253a is switched on to electrically connect the gas guide 235 and the high-frequency power supply 252. In the second switch 254, the terminal 254a is switched on to electrically connect the gas dispersion plate 234 and the high-frequency power supply 252. That is, the gas guide 235 and the gas dispersion plate 234 are set to the same electric potential. An electric potential difference occurs between the substrate support 210 and the gas dispersion plate 234 connected to the ground. In this state, the high-frequency power supply 252 is driven.

When the high-frequency power supply 252 is driven, the ammonia gas supplied into the process chamber 201 is excited into a plasma state. Then the already formed titanium containing layer is modified, for example, into a layer containing a titanium element and a nitrogen element on the wafer 200 due to the ammonia plasma.

The layer containing the titanium element and the nitrogen element is formed to a predetermined thickness, in a predetermined distribution, and to a depth such that a predetermined nitrogen component permeates into the titanium containing layer, based on, for example, the pressure in the process chamber 201, the flow rate of the ammonia gas, the temperature of the substrate supporting table 212, a power supply state of the plasma generation unit 250, etc.

After a predetermined time passes, the valve 244d is closed to stop the supply of the ammonia gas.

[Second Shower Head Exhaust Process (Operation S210)]

After the supply of the ammonia gas is stopped, the valve 237 is 'on' to exhaust an atmosphere in the shower head 230. Specifically, an atmosphere in the buffer chamber 232 is exhausted. In this case, the vacuum pump 239 is operated beforehand. The shower head exhaust process (operation S210) will be described in detail below.

The degree of opening/closing the valve 237 is adjusted such that an exhaust conductance in the buffer chamber 232 using the first exhaust system is higher than the conductance of the vacuum pump 225 via the process chamber 201. Through the adjustment, the flow of a gas is formed toward the shower head exhaust hole 231e from the center of the buffer chamber 232. Thus, a gas attached to a wall of the buffer chamber 232 of a gas floating in the buffer space is prevented from flowing into the process chamber 201 and is exhausted from the first exhaust system.

[Second Process Chamber Exhaust Process (Operation S212)]

After a predetermined time passes, while the vacuum pump 225 of the second exhaust system is operated, the degree of openness of the APC valve 223 and the degree of openness of the valve 237 are adjusted such that an exhaust conductance in the process space using the second exhaust system is higher than an exhaust conductance using the first exhaust system via the shower head 230. Through the adjustment, the flow of a gas passing through the process chamber 201 and flowing toward the second exhaust system is formed. Thus an inert gas supplied into the buffer chamber 232 may be surely supplied onto the wafer 200, thereby increasing the efficiency of removing a remnant gas from the wafer 200.

The inert gas supplied in the process chamber exhaust process) causes a titanium component that is not combined with the wafer 200 in the first process gas supply process (operation S202) to be removed from the wafer 200. Also, the valve 237 is opened, and the pressure adjustor 238 and the vacuum pump 239 are controlled to remove ammonia gas remaining in the shower head 230. After predetermined time passes, the valve 243d is closed to stop the supply of the inert gas and the valve 237 is closed to disconnect the shower head 230 and the vacuum pump 239 from each other.

It is more preferable that after the predetermined time passes, the valve 237 be closed while the vacuum pump 225 of the second exhaust system is operated. In this case, the flow of either the remnant gas in the buffer chamber 232 or the supplied inert gas, which passes through the process chamber 201 and flows toward the second exhaust system, is not influenced by the first exhaust system, thereby guaranteeing the supply of the inert gas onto the wafer 200. Accordingly, the efficiency of removing the remnant gas that does not completely react with the first gas from the wafer 200 is greatly increased.

Also, when the process chamber exhaust process (operation S206) is performed after the shower head exhaust process (operation S204), the following effect may be obtained. That is, since remnants in the buffer chamber 232 are removed in the shower head exhaust process (operation S204), a remnant gas may be prevented from being attached to the wafer 200 even when a gas passes through the wafer 200 in the process chamber exhaust process (operation S206).

[Determination Process (Operation S214)]

The controller 260 determines whether one cycle including the processes described above is performed a predetermined number of times.

When it is determined that the cycle is not performed the predetermined number of times ('NO' in operation S214), the cycle including the first process gas supply process (operation S202), the first shower head exhaust process (operation S204), the first process chamber exhaust process (operation S206), the second process gas supply process (operation S208), the second shower head exhaust process (operation S210), and the second process chamber exhaust process (operation S212) is performed again. When it is determined that the cycle is performed the predetermined number of times ('YES' in operation S214), the thin film forming process (operation S104) is ended.

In the second process gas supply process (operation S208) included in the thin film forming process (operation S104), the high-frequency power supply 252 is driven whenever the process is performed, but embodiments of the present invention are not limited thereto and the high-frequency power supply 252 may be continuously driven. In this case, according to the Paschen's law, plasma generation pressure is controlled to be maintained only when ammonia gas is supplied.

Figure 4:
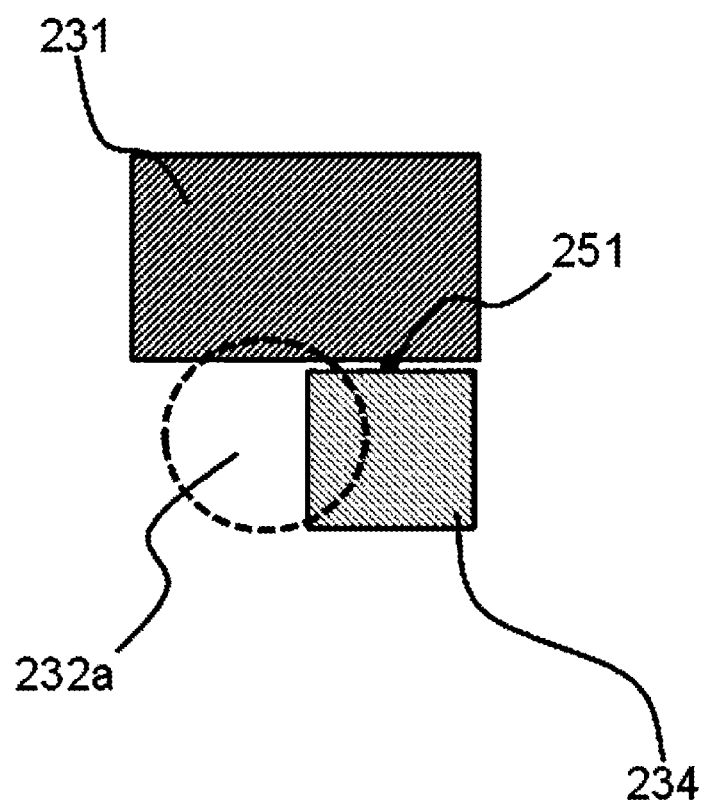
FIG. 4 is a diagram illustrating gas stagnation in the substrate processing apparatus according to the first embodiment of the present invention.
Figure 5:
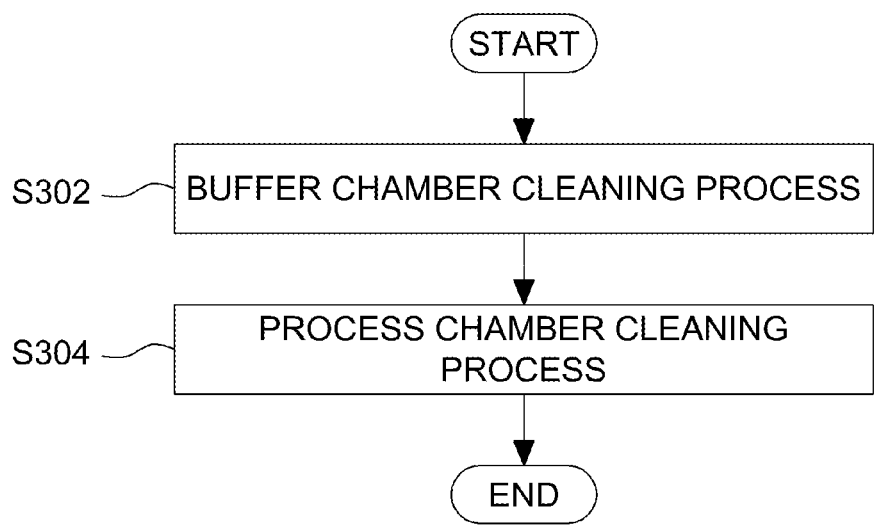
FIG. 5 is a flowchart of a cleaning process according to the first embodiment of the present invention.

Next, the cleaning process (operation S110) will be described in detail. The inventors of the present application have conducted research and found that the related art further has several problems in addition to an increase in the downtime. As a second problem, the film thickness of a deposit attached to an inner wall of the buffer chamber 232 partially increases, thereby causing a non-uniform film thickness. This is because that the buffer chamber 232 has a structure that causes gas stagnation to occur frequently, compared to the process chamber 201. Thus, the buffer chamber 232 and the process chamber 201 are difficult to clean according to the conditions described above. Also, gas stagnation occurs due to the internal region 232a of the buffer chamber 232 which is a corner portion as illustrated in FIG. 4.

As a third problem, the thickness of a deposit attached to or the quality of a film formed on the plate portion 235b of the gas guide 235 is not uniform. Non-uniform film thickness or quality may be due to, for example, a heating deviation of the gas guide 235. Although the gas guide 235 is heated by the shower head heating unit 231d, a heated state of the vicinity of the base end portion 235a and a heated state of the vicinity of the front end portion 235c are greatly different since as the plate portion 235b becomes distanced apart from the shower head heating unit 231d as the plate portion 235b becomes closer to the front end portion 235c. Also, when a gas flowing between the shower head heating unit 231d and the gas guide 235 has a high concentration, radiant heat radiated from the shower head heating unit 231d may be blocked. Thus, a heating deviation occurs due to the high concentration of the gas. In addition, the heating deviation may occur when the material of the lid 231 has a dense texture.

Since the thickness of a deposit or film quality is likely to be influenced by temperature, the thickness of the deposit or film quality becomes non-uniform due to the heating deviation. Here, film quality means, for example, the density or composition ratio of a film. As a result, stress is concentrated on some points on the deposit, thereby causing a film to be easily peeled.

In the present embodiment, a cleaning method capable of solving these problems will be described below.

[Buffer Chamber Cleaning Process (Operation S302)]

In the third gas supply system, the valve 248d is 'on' to begin supply of a cleaning gas. The cleaning gas is, for example, nitrogen trifluoride ($NF_3$) or carbon tetrafluoride ($CF_4$). An operation of the plasma generation unit 250 will now be described. In the first switch 253, the terminal 253a is switched on to electrically connect the gas guide 235 and the high-frequency power supply 252. In the second switch 254, the terminal 254b is switched on to connect the gas dispersion plate 234 to the ground. That is, an electric potential difference occurs between the gas guide 235 and the gas dispersion plate 234. The high-frequency power supply 252 is driven in this case.

In this case, the MFC 248c is controlled to adjust the flow rate of the cleaning gas to be equal to a predetermined flow rate. Also, the supply flow rate of the cleaning gas is, for example, in the range of 100 sccm to 5,000 sccm. Also, $N_2$ gas may be supplied as a carrier gas from a third inert gas supply system, together with the cleaning gas. Also, the degree of openness of the APC valve 237 is appropriately controlled to adjust the pressure in the buffer chamber 232 to be equal to a predetermined pressure at which the cleaning gas is easily excited.

An electric potential difference occurs between the gas guide 235 and the gas dispersion plate 234 and the buffer chamber 232 is controlled based on the predetermined pressure. Thus, the cleaning gas supplied into the buffer chamber 232 changes into a plasma state in the buffer chamber 232. The cleaning gas that is in the plasma state causes a deposit to be removed from the buffer chamber 232. Cleaning conditions, such as a cleaning time, are appropriately controlled based on the thickness or quality of a film to be cleaned.

[Process Chamber Cleaning Process (Operation S304)]

A plasma generation region switching unit of the plasma generation unit 250 switches a cleaning gas plasma generation region by performing an operation which will be described below. In the first switch 253, the terminal 253a is switched on to electrically connect the gas guide 235 and the high-frequency power supply 252. In the second switch 254, the terminal 254a is switched on to electrically connect the gas dispersion plate 234 and the high-frequency power supply 252. That is, the gas guide 235 and the gas dispersion plate 234 are set to the same electric potential. An electric potential difference occurs between the substrate support 210 and the gas dispersion plate 234 connected to the ground. The high-frequency power supply 252 is driven in this state.

In this case, the MFC 248c is controlled to adjust the flow rate of the cleaning gas to be equal to a predetermined flow rate. Also, the supply flow rate of the cleaning gas is, for example, in the range of 100 sccm to 5,000 sccm. Also, $N_2$ gas may be supplied as a carrier gas from the third inert gas supply system, together with the cleaning gas. Also, the degree of openness of the APC valve 223 is appropriately adjusted to change the pressure in the process chamber 201 into a predetermined pressure at which the cleaning gas is easily excited.

An electric potential difference occurs between the gas dispersion plate 234 and the substrate support 210, and the process chamber 201 is controlled according to the predetermined pressure to change the cleaning gas, which is supplied into the process chamber 201, into a plasma state in the buffer chamber 232. The cleaning gas that is in the plasma state removes a deposit attached into the process chamber 201. Cleaning conditions such as a cleaning time are appropriately controlled based on the thickness or quality of a film to be cleaned.

Also, the inventors of the present application have conducted research and found that the film thickness of a deposit attached into the buffer chamber 232 and the film thickness a deposit attached into the process chamber 201 are different as will be described below. In the process chamber 201, a reactive gas that is in a plasma state reacts with a source gas attached to the process chamber 201 and thus a film is easily formed. In the buffer chamber 232, a reactive gas that is a non-plasma state contacts walls of the buffer chamber 232 or a deposit attached to the gas guide 235 but the reactive gas has low reaction energy. Thus, a film attached into the buffer chamber 232 is thinner than a film attached into the process chamber 201.

Therefore, in the present embodiment, a process time of a buffer chamber cleaning process (operation S302) is set to be shorter than that of a process chamber cleaning process (operation S304), thereby reducing a downtime.

Also, in the present embodiment, the buffer chamber cleaning process (operation S302) and the process chamber cleaning process (operation S304) are sequentially performed, but embodiments of the present invention are limited thereto and the buffer chamber cleaning process (operation S302) may be performed after the process chamber cleaning process (operation S304).

When the cleaning process is performed as described above, the cleaning process may be individually performed in the buffer chamber 232 or the process chamber 201, and various process conditions may be satisfied. Also, any deposit may be removed from the inside of the shower head 230 or the inside of the process chamber 201 using the cleaning gas, thereby reducing a downtime caused by maintenance.

Second Embodiment of the Present Invention

Next, a second embodiment of the present invention will be described. A structure of a substrate processing apparatus and a substrate loading and placing process (operation S102) to a determination process (operation S108) included in a substrate processing process in the second embodiment are the same as those in the first embodiment and will be thus not described again. Here, a cleaning process (operation S110) in the second embodiment that is different from that in the first embodiment will be described below. The cleaning process (operation S110) is a process of transposing the cleaning process (operation S110) in the first embodiment.

[Cleaning Process (Operation S110)]

In the cleaning process (operation S110) in the first embodiment, the buffer chamber cleaning process (operation S302) and the process chamber cleaning process (operation S304) are performed. However, when the operation rate of a device is considered, a cleaning time is preferably reduced without increasing the number of processes.

The cleaning process (operation S110) according of the present embodiment will now be described.

In the third gas supply system, the valve 248d is 'on' to begin supply of a cleaning gas. The cleaning gas is, for example, nitrogen trifluoride ($NF_3$) or carbon tetrafluoride ($CF_4$). An operation of the plasma generation unit 250 will now be described. In the first switch 253, the terminal 253b is switched on to electrically connect the gas guide 235 to the ground. In the second switch 254, the terminal 254a is switched on to connect the gas dispersion plate 234 to the high-frequency power supply 252. That is, an electric potential difference occurs between the gas guide 235 and the gas dispersion plate 234. Also, an electric potential difference occurs between the gas dispersion plate 234 and the substrate support 210. The high-frequency power supply 252 is driven in this state.

In this case, In this case, the MFC 248c is controlled to adjust the flow rate of the cleaning gas to be equal to a predetermined flow rate. Also, the supply flow rate of the cleaning gas is, for example, in the range of 100 sccm to 5,000 sccm. Also, $N_2$ gas may be supplied as a carrier gas from the third inert gas supply system, together with the cleaning gas. Also, the degree of openness of the APC valve 237 and the degree of openness of the APC valve 223 are appropriately controlled to adjust the pressures in the buffer chamber 232 and the process chamber 201 to be equal to a predetermined pressure at which the cleaning gas is easily excited.

An electric potential difference occurs between the gas guide 235 and the gas dispersion plate 234 and the buffer chamber 232 is controlled based on the predetermined pressure. Thus, the cleaning gas supplied into the buffer chamber 232 changes into a plasma state in the buffer chamber 232. At the same time, an electric potential difference occurs between the gas dispersion plate 234 and the substrate support 210 and the process chamber 201 is controlled based the predetermined pressure. Thus, the cleaning gas supplied into the process chamber 201 changes into a plasma state in the process chamber 201.

The cleaning gas that is in the plasma state causes a deposit to be removed from the buffer chamber 232 and the process chamber 201. Cleaning conditions, such as a cleaning time, are appropriately controlled based on the thickness or quality of a film to be cleaned.

With the cleaning process (operation S110) configured as described above, a time required to clean the process chamber 201 and the buffer chamber 232 may be reduced, thereby greatly improving the operation rate of the system.

Although cases in which a titanium nitride film is formed on the wafer 200 using a titanium containing gas as a first-element-containing gas and a nitrogen containing gas as a second-element-containing gas have been described above in the previous embodiments, embodiments of the present invention are not limited thereto. For example, a high-k film, such as a hafnium oxide film (HfO film), a zirconium oxide film (ZrO film), or a titanium oxide film (TiO film), may be formed on the wafer 200 using silicon (Si), a hafnium (Hf) containing gas, zirconium (Zr) containing gas, or a titanium (Ti) containing gas as the first-element-containing gas.

Also, although the shower head exhaust hole 231e connected to the first exhaust system is formed in the ceiling plate 231a of the shower head 230 in the previous embodiments, embodiments of the present invention are not limited thereto and the shower head exhaust hole 231b may be formed, for example, in a side surface of the buffer chamber 232.

Also, although the flange 242a of the second common gas supply pipe 242 and the plasma generation unit 250 are electrically connected in the previous embodiments, embodiments of the present invention are not limited thereto and the gas guide 235 and the plasma generation unit 250 may be electrically connected.

Also, although all various gas supply pipes for supplying a source gas, a reactive gas, an inert gas, and a cleaning gas are integrated as the common gas supply pipes 241 and 242 in the previous embodiments, embodiments of the present invention are not limited thereto. For example, the various gas supply pipes may be configured to be connected to the ceiling plate 231a and these gases may be supplied into the buffer chamber 232 via these gas supply pipes. In this case, at least introduction holes via which the source gas and the reactive gas are introduced are configured to supply the gases into the gas guide 235 in order to evenly supply the gases.

According to the present invention, a substrate processing apparatus and a method of manufacturing a semiconductor device which are capable of maintaining high working efficiency of even an apparatus using a shower head are provided.

The following supplementary notes are added herein as exemplary embodiments of the present invention.

[Supplementary Note 1]

According to one aspect of the present invention, there is provided a substrate processing apparatus including a first gas supply system connected to a source gas source and including a source gas supply pipe at which a source gas supply control unit is installed; a second gas supply system connected to a reactive gas source and including a reactive gas supply pipe at which a reactive gas supply control unit is installed; a third gas supply system connected to a cleaning gas source and including a reactive gas supply pipe at which a cleaning gas supply control unit is installed; a shower head unit including a buffer chamber to which the first gas supply system, the second gas supply system and the third gas supply system are connected; a process chamber installed below the shower head and accommodating a substrate support configured to support a substrate thereon; a plasma generation region switching unit configured to switch between plasma generation in the buffer chamber and plasma generation in the process chamber; a plasma generation unit including the plasma generation region switching unit and a power supply; and a control unit configured to control at least the source gas supply control unit, the reactive gas supply control unit and the plasma generation unit.

[Supplementary Note 2]

In the substrate processing apparatus of Supplementary note 1, the shower head unit includes a ceiling portion serving as a lid of the buffer chamber; a gas guide including a base end portion connected to the ceiling portion and a plate portion extending from the base end portion to a front end portion to be gradually distanced from the ceiling portion; and a dispersion unit installed at the ceiling portion as a lower portion of the buffer chamber, the dispersion unit including a heating unit for heating at least an inner atmosphere of the buffer chamber and the gas guide and configured to disperse a gas supplied into the buffer chamber in the process chamber.

[Supplementary Note 3]

In the substrate processing apparatus of one of Supplementary note 1 or 2, it is preferable that the switch includes: a first switch including a first terminal electrically connected to the a guide and a second terminal electrically connected to one of the power supply and the ground; and a second switch including a first terminal electrically connected to the dispersion plate and a second terminal electrically connected to one of the power supply and the ground.

[Supplementary Note 4]

In the substrate processing apparatus of one of Supplementary notes 1 to 3, it is preferable that the control unit is configured to control at least the source gas supply control unit, the reactive gas supply control unit, the cleaning gas supply control unit and the plasma generation unit to perform: (a) processing a substrate by supplying one of a source gas and a reactive gas into the process chamber via the buffer chamber while the substrate is accommodated in the process chamber; (b) cleaning the buffer chamber by supplying a cleaning gas into the buffer chamber and generating a plasma from the cleaning gas in the buffer chamber with an electric potential difference between the gas guide and the dispersion plate after the step (a) is performed; and (c) cleaning the process chamber by supplying the cleaning gas into the process chamber via the buffer chamber and generating a plasma from the cleaning gas in the process chamber with an electric potential difference between the dispersion plate and the substrate support.

[Supplementary Note 5]

In the substrate processing apparatus of Supplementary note 4 or 5, it is preferable that the control unit is configured to control the switch to electrically connect the gas guide to the power supply and the dispersion plate to the ground in the step (b), and to electrically connect the gas guide to the ground and the dispersion plate to the power supply in the step (c).

[Supplementary Note 6]

In the substrate processing apparatus of Supplementary note 4 or 5, it is preferable that the control unit is configured to control at least the cleaning gas supply control unit and the plasma generation unit in a manner that a process time of the step (b) is shorter than that of the step (c).

[Supplementary Note 7]

According to another aspect of the present invention, there is provided a method of manufacturing a semiconductor device, including:

(a) loading a substrate into a process chamber;

(b) processing the substrate by supplying a process gas into the process chamber via a shower head disposed above the process chamber and including a buffer chamber;

(c) unloading the substrate from the process chamber; and (d) cleaning the buffer chamber and the process chamber after performing the step (c), wherein the step (d) includes:

(d-1) cleaning the buffer chamber by a plasma generation from a cleaning gas in the buffer chamber by a plasma generation unit including a plasma generation region switching unit; and (d-2) cleaning the process chamber by switching the plasma generation from the cleaning gas in the buffer chamber to a plasma generation from the cleaning gas in the process chamber by the plasma generation region switching unit.

What is claimed is:

1. A substrate processing apparatus comprising:
a first gas supply system connected to a source gas source and including a first gas supply pipe provided with a source gas supply control unit;
a second gas supply system connected to a reactive gas source and including a second gas supply pipe provided with a reactive gas supply control unit;

a third gas supply system connected to a cleaning gas source and including a third gas supply pipe provided with a cleaning gas supply control unit;

a shower head unit including a buffer chamber connected to the first gas supply system, the second gas supply system and the third gas supply system and a dispersion plate installed at a downstream side of the buffer chamber;

a substrate support installed at a downstream side of the dispersion plate and electrically connected to a ground;

a process chamber accommodating the substrate support;

a plasma generation unit including a power supply and a switch configured to switch between a plasma generation in the buffer chamber and a plasma generation in the process chamber; and a control unit configured to control at least the source gas supply control unit, the reactive gas supply control unit and the plasma generation unit.

2. The substrate processing apparatus of claim 1, wherein the shower head unit comprises:

a ceiling plate covering the buffer chamber;

a gas guide including a base end portion connected to the ceiling plate and a plate portion extending from the base end portion toward a front end portion of the gas guide to be gradually distanced from the ceiling plate; and a heating mechanism installed at the ceiling plate and configured to heat at least an inner atmosphere of the buffer chamber and the gas guide.

3. The substrate processing apparatus of claim 1, wherein the switch comprises:

a first switch including a first terminal electrically connected to the a guide and a second terminal electrically connected to one of the power supply and the ground; and a second switch including a first terminal electrically connected to the dispersion plate and a second terminal electrically connected to one of the power supply and the ground.

4. The substrate processing apparatus of claim 2, wherein the switch comprises:

a first switch including a first terminal electrically connected to a gas guide and a second terminal electrically connected to one of the power supply and the ground; and a second switch including a first terminal electrically connected to the dispersion plate and a second terminal electrically connected to one of the power supply and the ground.

5. The substrate processing apparatus of claim 1, wherein the control unit is configured to control at least the source gas supply control unit, the reactive gas supply control unit, the cleaning gas supply control unit and the plasma generation unit to perform: (a) processing a substrate by supplying one of a source gas and a reactive gas into the process chamber via the buffer chamber while the substrate is accommodated in the process chamber; (b) cleaning the buffer chamber by supplying a cleaning gas into the buffer chamber and generating a plasma from the cleaning gas in the buffer chamber with an electric potential difference between a gas guide and the dispersion plate after the step (a) is performed; and (c) cleaning the process chamber by supplying the cleaning gas into the process chamber via the buffer chamber and generating a plasma from the cleaning gas in the process chamber with an electric potential difference between the dispersion plate and the substrate support.

6. The substrate processing apparatus of claim 2, wherein the control unit is configured to control at least the source gas supply control unit, the reactive gas supply control unit, the cleaning gas supply control unit and the plasma generation unit to perform: (a) processing a substrate by supplying one of a source gas and a reactive gas into the process chamber via the buffer chamber while the substrate is accommodated in the process chamber; (b) cleaning the buffer chamber by supplying a cleaning gas into the buffer chamber and generating a plasma from the cleaning gas in the buffer chamber with an electric potential difference between the gas guide and the dispersion plate after the step (a) is performed; and (c) cleaning the process chamber by supplying the cleaning gas into the process chamber via the buffer chamber and generating a plasma from the cleaning gas in the process chamber with an electric potential difference between the dispersion plate and the substrate support.

7. The substrate processing apparatus of claim 3, wherein the control unit is configured to control at least the source gas supply control unit, the reactive gas supply control unit, the cleaning gas supply control unit and the plasma generation unit to perform: (a) processing a substrate by supplying one of a source gas and a reactive gas into the process chamber via the buffer chamber while the substrate is accommodated in the process chamber; (b) cleaning the buffer chamber by supplying a cleaning gas into the buffer chamber and generating a plasma from the cleaning gas in the buffer chamber with an electric potential difference between a gas guide and the dispersion plate after the step (a) is performed; and (c) cleaning the process chamber by supplying the cleaning gas into the process chamber via the buffer chamber and generating a plasma from the cleaning gas in the process chamber with an electric potential difference between the dispersion plate and the substrate support.

8. The substrate processing apparatus of claim 5, wherein the control unit is configured to control the switch to electrically connect the gas guide to the power supply and the dispersion plate to the ground in the step (b), and to electrically connect the gas guide to the ground and the dispersion plate to the power supply in the step (c).

9. The substrate processing apparatus of claim 6, wherein the control unit is configured to control the switch to electrically connect the gas guide to the power supply and the dispersion plate to the ground in the step (b), and to electrically connect the gas guide to the ground and the dispersion plate to the power supply in the step (c).

10. The substrate processing apparatus of claim 7, wherein the control unit is configured to control the switch to electrically connect the gas guide to the power supply and the dispersion plate to the ground in the step (b), and to electrically connect the gas guide to the ground and the dispersion plate to the power supply in the step (c).

11. The substrate processing apparatus of claim 5, wherein the control unit is configured to control at least the cleaning gas supply control unit and the plasma generation unit in a manner that a process time of the step (b) is shorter than that of the step (c).

12. The substrate processing apparatus of claim 6, wherein the control unit is configured to control at least the cleaning gas supply control unit and the plasma generation unit in a manner that a process time of the step (b) is shorter than that of the step (c).

13. The substrate processing apparatus of claim 7, wherein the control unit is configured to control at least the cleaning gas supply control unit and the plasma generation unit in a manner that a process time of the step (b) is shorter than that of the step (c).

* * * * *